(12) United States Patent
Huang et al.

(10) Patent No.: US 9,735,261 B2
(45) Date of Patent: Aug. 15, 2017

(54) SEMICONDUCTOR DEVICE AND FORMATION THEREOF

(71) Applicant: Taiwan Semiconductor Manufacturing Company Limited, Hsin-Chu (TW)

(72) Inventors: Mao-Lin Huang, Hsinchu (TW); Chien-Hsun Wang, Hsinchu (TW); Chun-Hsiung Lin, Zhubei (TW); Meng-Ku Chen, New Taipei (TW); Li-Ting Wang, Hsinchu (TW); Hung-Ta Lin, Hsinchu (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 0 days.

(21) Appl. No.: 14/929,523

(22) Filed: Nov. 2, 2015

(65) Prior Publication Data

US 2016/0071966 A1    Mar. 10, 2016

Related U.S. Application Data

(62) Division of application No. 14/074,888, filed on Nov. 8, 2013, now Pat. No. 9,184,289.

(51) Int. Cl.
| | |
|---|---|
| *H01L 29/778* | (2006.01) |
| *H01L 29/78* | (2006.01) |
| *H01L 21/324* | (2006.01) |
| *H01L 21/322* | (2006.01) |
| *H01L 29/66* | (2006.01) |
| *H01L 29/10* | (2006.01) |
| *H01L 29/205* | (2006.01) |

(52) U.S. Cl.
CPC ........ *H01L 29/7786* (2013.01); *H01L 21/322* (2013.01); *H01L 21/324* (2013.01); *H01L 29/1033* (2013.01); *H01L 29/205* (2013.01); *H01L 29/66522* (2013.01); *H01L 29/78* (2013.01); *H01L 29/7848* (2013.01)

(58) Field of Classification Search
CPC ..... H01L 21/823807; H01L 21/823412; H01L 29/365
See application file for complete search history.

(56) References Cited

U.S. PATENT DOCUMENTS

| | | | | |
|---|---|---|---|---|
| 2001/0042889 A1* | 11/2001 | Kang | ............. | H01L 21/823807 257/371 |
| 2006/0255375 A1* | 11/2006 | Dokumaci | ........ | H01L 21/26586 257/270 |

(Continued)

*Primary Examiner* — Joshua King
*Assistant Examiner* — Mohammed R Alam
(74) *Attorney, Agent, or Firm* — Cooper Legal Group, LLC

(57) ABSTRACT

A semiconductor devices and method of formation are provided herein. A semiconductor device includes a gate structure over a channel and an active region adjacent the channel. The active region includes a repaired doped region and a growth region over the repaired doped region. The repaired doped region includes a first dopant and a second dopant, where the second dopant is from the growth region. A method of forming a semiconductor device includes increasing a temperature during exposure to at least one of dopant(s) or agent(s) to form an active region adjacent a channel, where the active region includes a repaired doped region and a growth region over the repaired doped region.

20 Claims, 5 Drawing Sheets

(56) References Cited

U.S. PATENT DOCUMENTS

| | | | |
|---|---|---|---|
| 2007/0037326 A1* | 2/2007 | Chen | H01L 21/26506 438/151 |
| 2008/0308878 A1* | 12/2008 | Bulucea | H01L 21/823807 257/371 |
| 2012/0280251 A1* | 11/2012 | Dube | H01L 29/66628 257/77 |
| 2013/0029463 A1* | 1/2013 | Illgen | H01L 21/823814 438/199 |
| 2013/0069123 A1* | 3/2013 | Illgen | H01L 21/823807 257/288 |
| 2013/0178024 A1* | 7/2013 | Flachowsky | H01L 21/823807 438/199 |
| 2015/0061010 A1* | 3/2015 | Cheng | H01L 29/0692 257/344 |

* cited by examiner

SEMICONDUCTOR DEVICE AND FORMATION THEREOF

RELATED APPLICATION

This application is a divisional of and claims priority to U.S. patent application Ser. No. 14/074,888, titled "SEMICONDUCTOR DEVICE AND FORMATION THEREOF" and filed on Nov. 8, 2013, which is incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
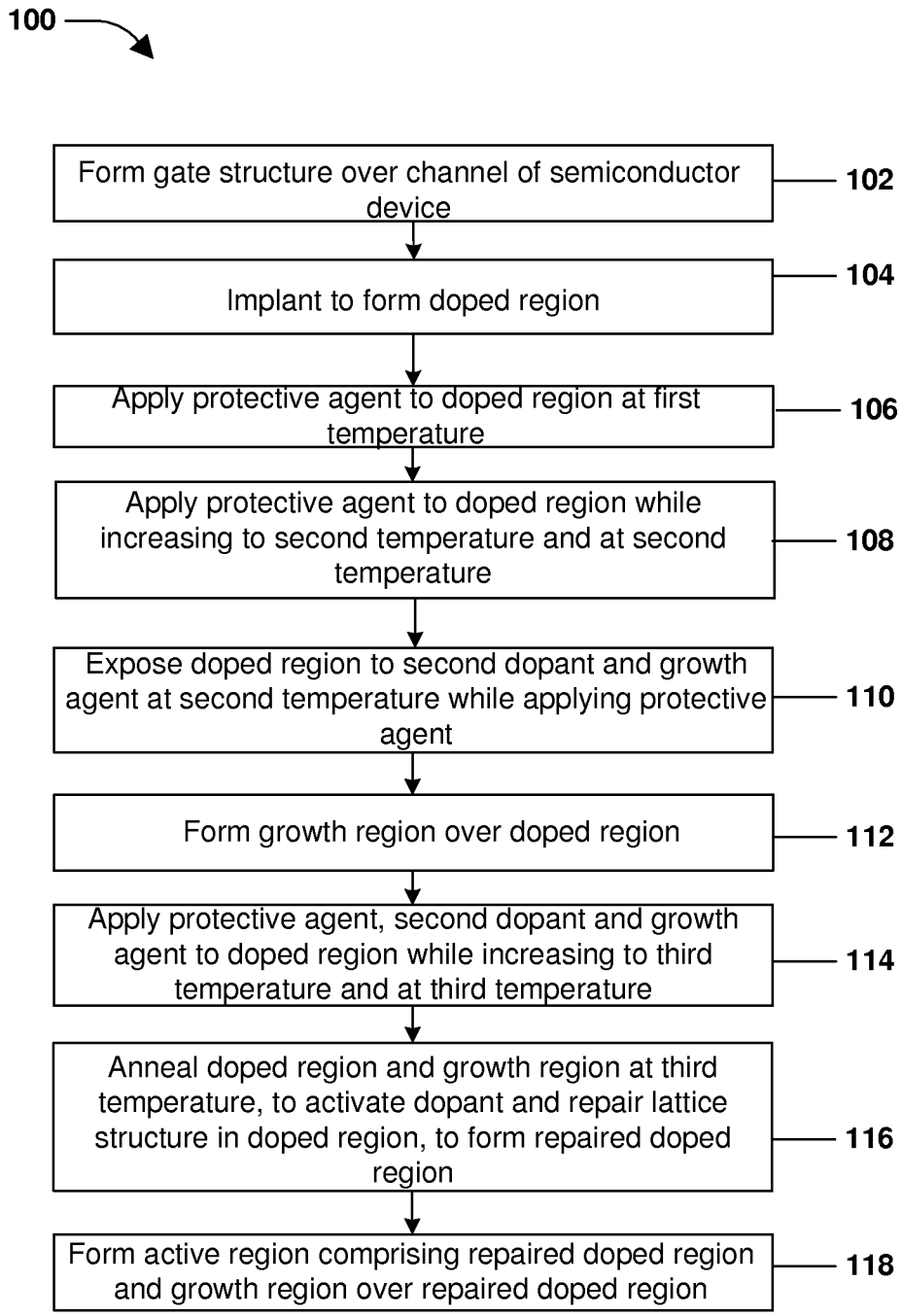
FIG. 1 is a flow diagram illustrating a method of forming a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

A semiconductor device comprising a gate structure over a channel and an active region adjacent the channel, where the active region has a repaired doped region and a growth region over the repaired doped region, as provided herein, has a high concentration of active dopant in the repaired doped region that lowers an extension resistance, a high concentration of active dopant in the growth region that lowers a contact resistance and a repaired lattice structure that lowers the contact resistance. In some embodiments, the repaired doped region is formed by applying a protective agent to a doped region at a first temperature and continuing to apply the protective agent to the doped region while increasing a temperature from the first temperature to a second temperature. The temperature is increased from the second temperature to a third temperature while continuing to apply the protective agent to the doped region and while exposing the doped region to a second dopant and a growth agent to form a growth region over the doped region. The doped region and the growth region are annealed to activate a dopant within the doped region and to form a first repaired lattice structure in the doped region to form a repaired doped region. The annealing is performed while applying the protective agent to the doped region and to the growth region and while exposing the doped region and the growth region to the second dopant and the growth agent at the third temperature. The active region thus comprises the repaired doped region and the growth region over the repaired doped region. In some embodiments, the active region is formed in a metal organic chemical vapor deposition (MOCVD) chamber. In some embodiments, the doped region comprises a shallow implanted region and a deep implanted region, where the deep implanted region is formed after the shallow implanted region. In some embodiments, the protective agent inhibits irregularities, non-uniformities or other issues from occurring at the doped region as the temperature increases from the first temperature to the second temperature. In some embodiments, the formation of the growth region in conjunction with the application of the protective agent inhibits irregularities, non-uniformities or other issues from occurring at the doped region as the temperature increases from the second temperature to the third temperature. In some embodiments, the formation of the growth region inhibits irregularities, non-uniformities or other issues from occurring at the doped region at the third temperature. In some embodiments, the growth region comprises the protective agent, the second dopant and the growth agent. In some embodiments, a lattice repair occurs between the second temperature and the third temperature. In some embodiments, the shallow implanted region, or a dopant thereof, migrates into the channel and under the gate structure during at least one of the first temperature or the third temperature.

Figure 9:
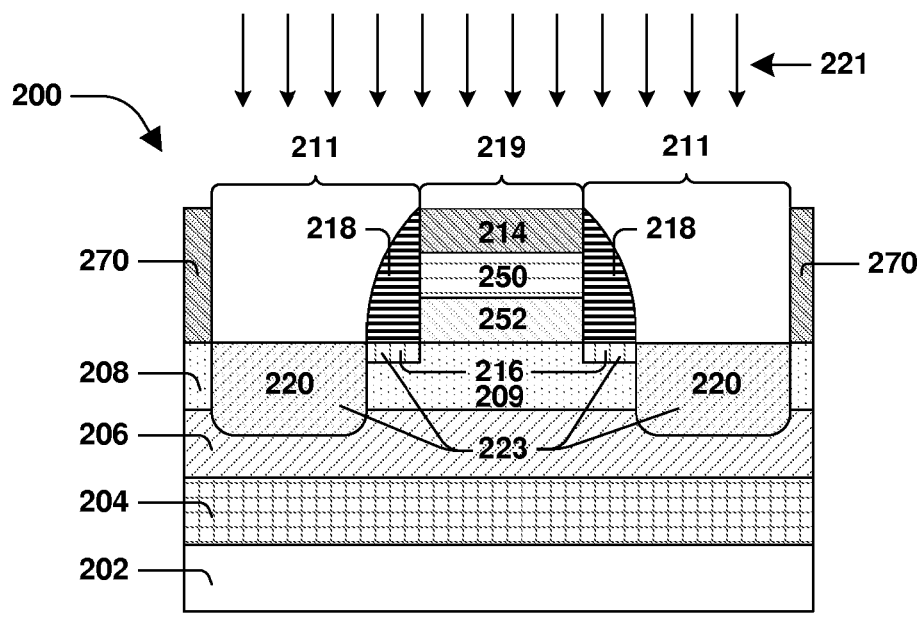
FIG. 9 is an illustration of a semiconductor device, according to some embodiments.
Figure 10:
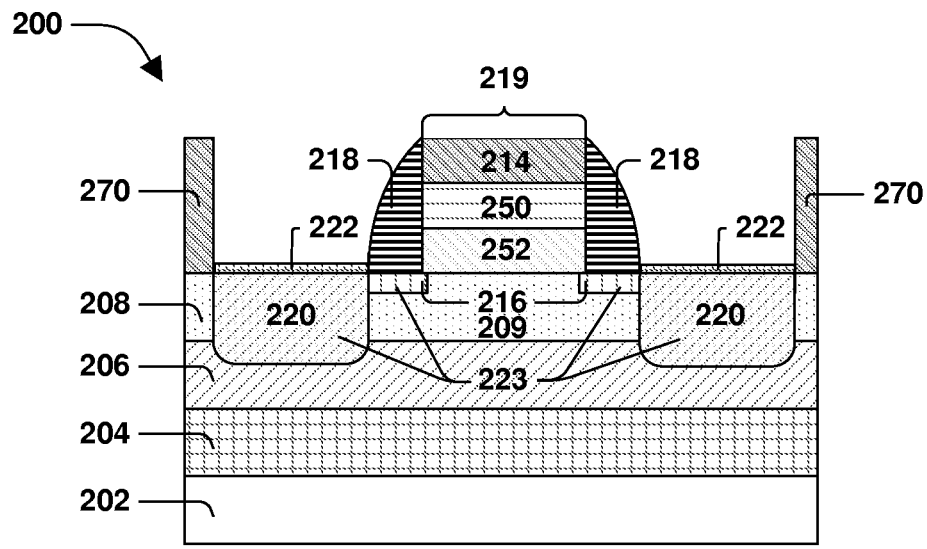
FIG. 10 is an illustration of a semiconductor device, according to some embodiments.
Figure 11:
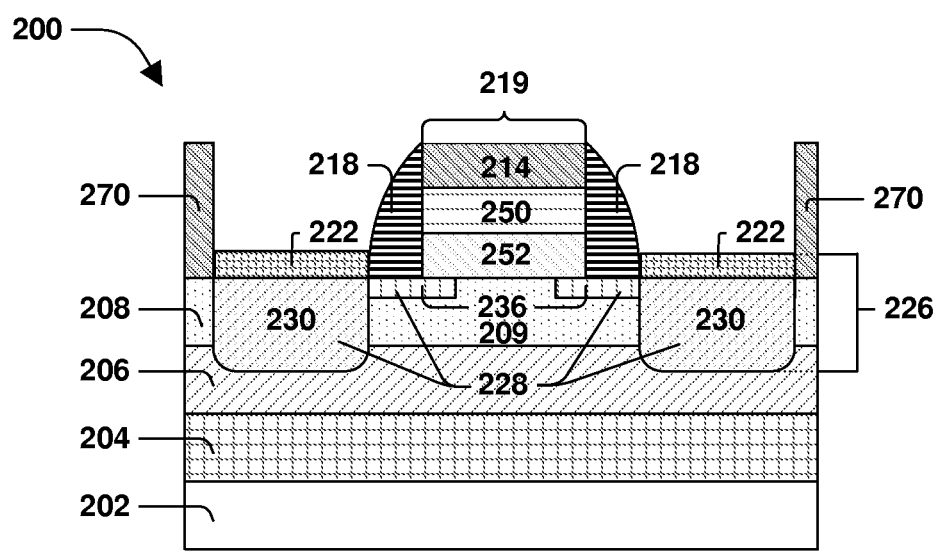
FIG. 11 is an illustration of a semiconductor device, according to some embodiments.

A first method 100 of forming a first semiconductor device 200 is illustrated in FIG. 1, and one or more semiconductor arrangements formed by such methodology are illustrated in FIGS. 2-11. As illustrated in FIG. 11, the first semiconductor device comprises a gate structure 219 over a channel 209, an active region 226 adjacent the channel 209, the active region 226 comprising a repaired doped region 228 and a growth region 222 over the repaired doped region 228. While reference is generally made herein to the active region 226, a second active region similar to the active region 226 is typically diametrically opposite the active region 226 across the channel, on an opposing side of the gate structure 219. As such, the same or similar reference characters are used in the Figs. for the second active region.

Figure 2:
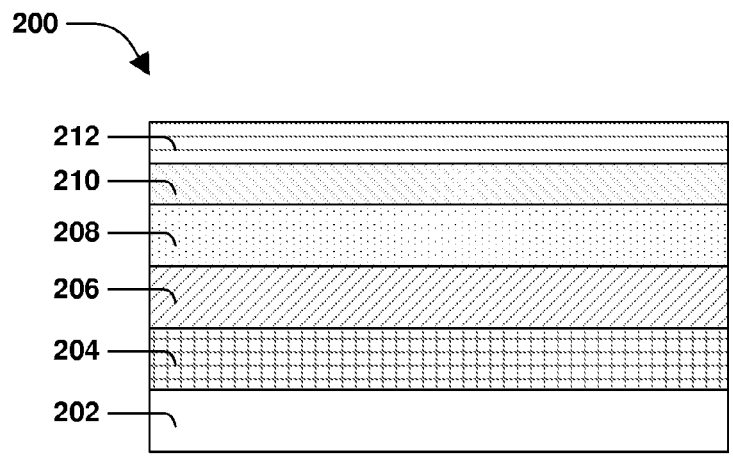
FIG. 2 is an illustration of a semiconductor device, according to some embodiments.

Turning to FIG. 2, formation of a semiconductor device 200 begins with a substrate 202, a buffer layer 204, a semi-insulating barrier layer 206, a channel layer 208, a layer of high dielectric constant material 210 and a layer of gate material 212. In some embodiments, the substrate 202 comprises at least one of silicon oxide ($SiO_2$) or silicon nitride ($Si_3N_4$). In some embodiments, the substrate 202 comprises an epitaxial layer, a silicon-on-insulator (SOI) structure, a wager, or a die formed form a wafer. In some embodiments, the substrate 202 is between about 50 nm to about 300 nm thick. In some embodiments, the buffer layer 204 is formed over the substrate 202. In some embodiments, the buffer layer 204 comprises a high band gap semi-insulating buffer. In some embodiments, the buffer layer 204 comprises at least one of an oxide, a phosphide, InAlAs or InP. In some embodiments, the buffer layer 204 is deposited, such as by metal organic chemical vapor deposition (MOCVD). In some embodiments, the buffer layer 204 is between about 250 nm thick to about 750 nm thick. In some embodiments, the semi-insulating barrier layer 206 is formed over the buffer layer 204. In some embodiments, the semi-insulating barrier layer 206 comprises at least one of InAlAs or InP. In some embodiments, the semi-insulating barrier layer 206 is deposited, such as by MOCVD. In some embodiments, the semi-insulating barrier layer 206 has a thickness of between about 50 nm to about 150 nm. In some embodiments, the channel layer 208 is formed over the semi-insulating barrier layer 206. In some embodiments, the channel layer 208 comprises a compound group of a at least one of group 3 element, such as aluminum (Al), indium (In), or gallium (Ga), or a group 5 element, such as arsenic (As), phosphorous (P), antimony (Sb). In some embodiments, the channel layer 208 comprises InGaAs. In some embodiments, the channel layer 208 is deposited, such as by MOCVD. In some embodiments, the channel layer 208 has a thickness of between about 3 nm to about 30 nm. In some embodiments, the layer of high dielectric constant material 210 is formed over channel layer 208. In some embodiments, the layer of high dielectric constant material 210 comprises at least one of a nitride or an oxide. In some embodiments, the layer of high dielectric constant material 210 comprises an aluminum oxide ($Al_2O_3$). In some embodiments, the layer of high dielectric constant material 210 is deposited, such as by atomic layer deposition (ALD). In some embodiments, the layer of high dielectric constant material 210 has a thickness of between about 3 nm to about 10 nm. In some embodiments, the layer of gate material 212 is formed over the layer of high dielectric constant material 210. In some embodiments, the layer of gate material 212 comprises a conductive material, such as metal. In some embodiments, the layer of gate material 212 comprises a least one of titanium nitride (TiN) or Copper (Cu). In some embodiments, a layer of hard mask material 260 is formed over the layer of gate material 212, as illustrated in FIG. 5.

Figure 3:
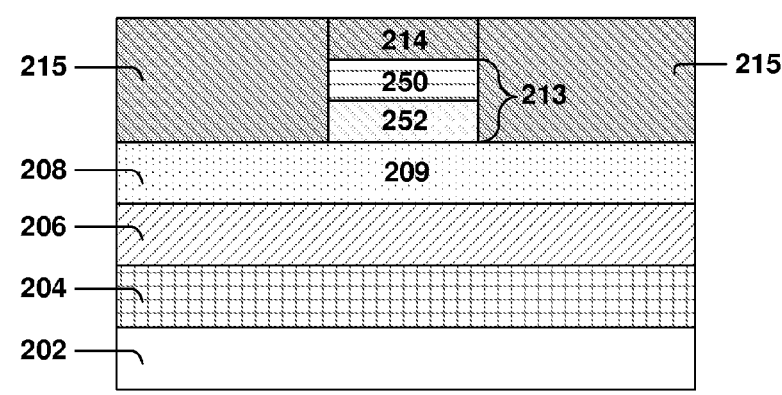
FIG. 3 is an illustration of a semiconductor device, according to some embodiments.
Figure 4:
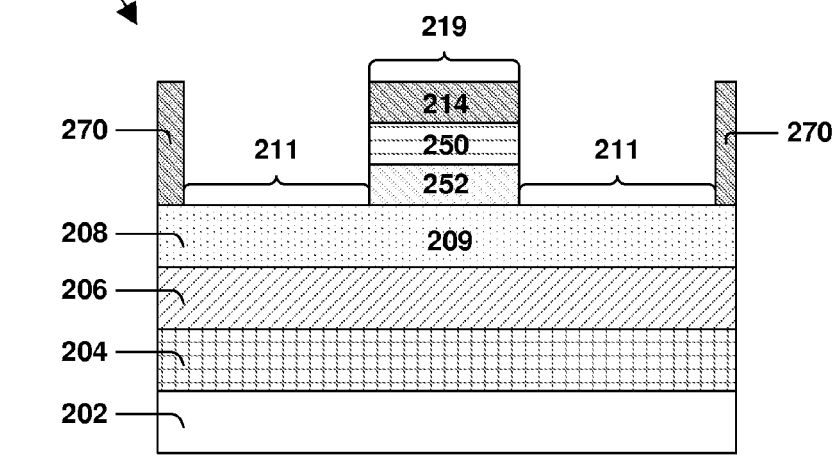
FIG. 4 is an illustration of a semiconductor device, according to some embodiments.
Figure 5:
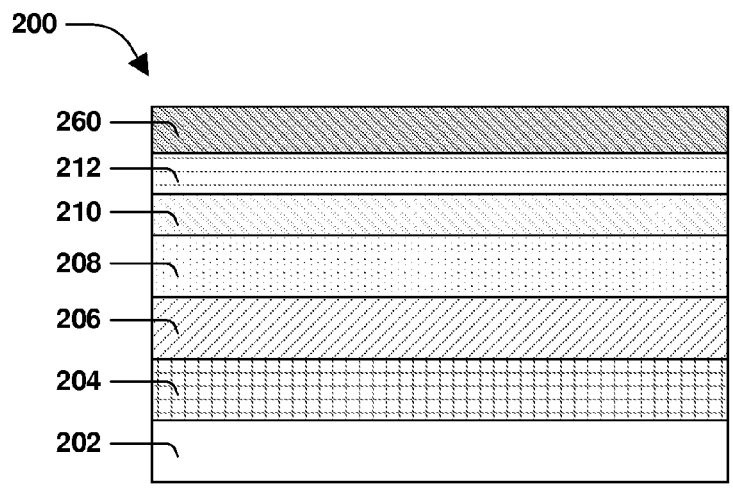
FIG. 5 is an illustration of a semiconductor device, according to some embodiments.
Figure 6:
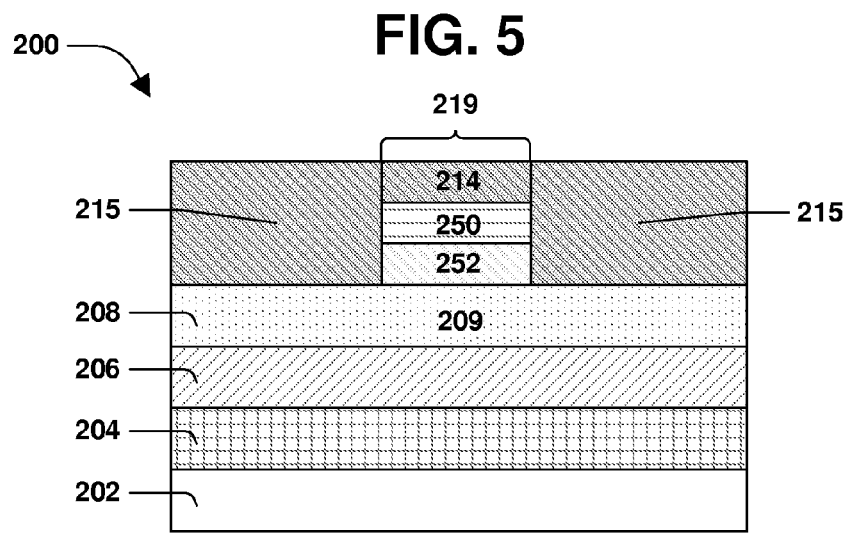
FIG. 6 is an illustration of a semiconductor device, according to some embodiments.
Figure 7:
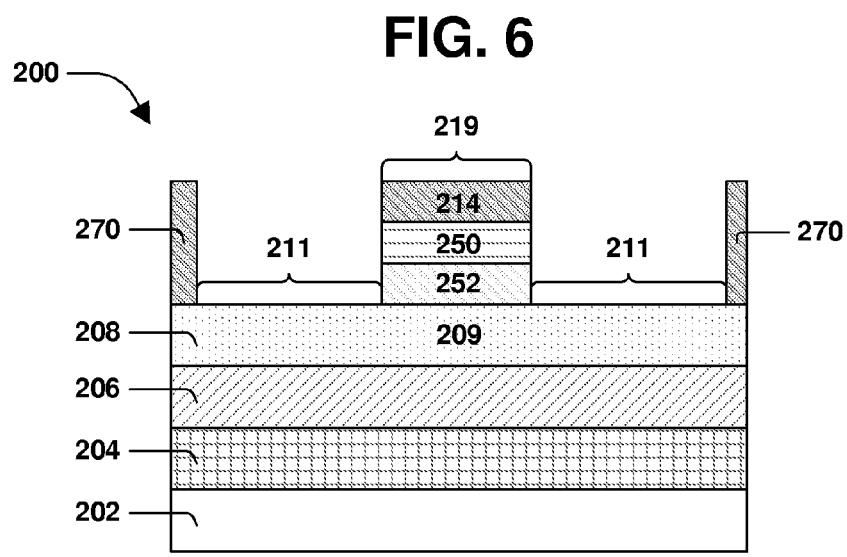
FIG. 7 is an illustration of a semiconductor device, according to some embodiments.

At 102, a gate structure 219 is formed over the channel 209 of the semiconductor device 200, as illustrated in FIGS. 2-7. The channel 209 corresponds to a portion of the channel layer 208 under the gate structure 219 between the active region 226 and the second active region. In some embodiments, the active region 226 is a source or a drain of the semiconductor device while the second active region is a drain or source of the semiconductor device, where a current flows from the source to the drain through the channel 209 when a sufficient bias or voltage is applied to a gate 250 of the gate structure 219. In some embodiments, the layer of high dielectric constant material 210 and the layer of gate material 212 are patterned to form a portion 213 of the gate structure 219, as illustrated in FIG. 3, where the portion 213 comprises a high-k dielectric 252 and the gate 250. In some embodiments, the portion 213 of the gate structure 219 is formed by etching the layer of gate material 212 and the layer of high dielectric constant material 210. In some embodiments, an oxide layer 215 is formed over the portion 213 of the gate structure 219. In some embodiments, the oxide layer 215 comprises an oxide, such as silicon oxide. In some embodiments, the oxide layer 215 forms a hard mask 214 over the portion 213 of the gate structure 219, as illustrated in FIG. 3. In some embodiments, the oxide layer is formed by deposition, such as ALD or MOCVD. In some embodiments, the oxide layer 215 has a thickness of between about 10 nm to about 45 nm over the channel layer 208, and a thickness of between about 2 nm to about 40 nm over the portion 213 of the gate structure 219, where it comprises the hard mask 214. In some embodiments, the hard mask 214 comprises an oxide. In some embodiments, the layer of hard mask material 260 is formed over the layer of gate material 212 prior to forming the portion 213 of the gate structure 219, as illustrated in FIG. 5. In some embodiments, the layer of hard mask material 260 is patterned such that some of the hard mask material is removed, while remaining portions of the layer of hard mask material 260 constitute the hard mask 214, as illustrated in FIG. 6. In some embodiments, the hard mask 214 comprises an oxide, such as silicon oxide. In some embodiments, the hard mask 214 has a thickness of between about 2 nm to about 40 nm. In some embodiments, the hard mask 214 serves as a mask to pattern the layer of gate material 212 and the layer of high dielectric constant material 210 to form the portion 213 of the gate structure 219. The gate structure 219 thus comprises the hard mask 214, the gate 250 and the high-k dielectric 252, as illustrated in FIG. 6. In some embodiments, the oxide layer 215 is formed over exposed portions of the channel layer 208, as illustrated in FIG. 6. Regardless of whether the hard mask 214 is formed as part of the oxide layer 215 as illustrated in FIG. 3 or prior to the oxide layer 215 as illustrated in FIG. 5, the oxide layer 215 is then patterned, such as via etching, such that a location 211 adjacent the channel 209 is exposed and the gate structure 219 is revealed, as illustrated in FIG. 3 and in FIG. 7. In some embodiments, a sidewall 270 is defined by remaining portions of the oxide layer 215, such that the location 211 adjacent the channel 209 is exposed between the sidewall 270 and the gate structure 219.

Figure 8:
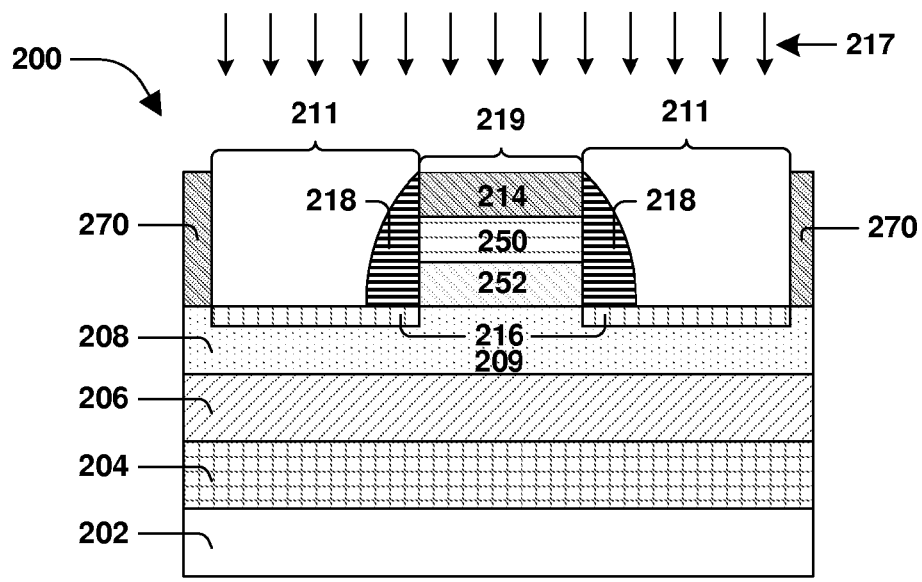
FIG. 8 is an illustration of a semiconductor device, according to some embodiments.

At 104, a first dopant is implanted in the location 211 adjacent the channel 209 to form a doped region 223, as illustrated in FIG. 9. Turning to FIG. 8, a shallow implanted region 216 is implanted in the location 211 adjacent the channel 209 by a first implantation 217. In some embodiments, the first implantation 217 comprises a dose between about $1e^{13}$ atoms/$cm^2$ to about $1e^{15}$ atoms/$cm^2$ of the first dopant at an energy of between about 0.5 keV to about 20 keV. In some embodiments, the shallow implanted region 216 comprises a compound group of a at least one of a group 3 element, such as aluminum (Al), indium (In), or gallium (Ga), or a group 5 element, such as arsenic (As), phosphorous (P), antimony (Sb). In some embodiments, the shallow implanted region 216 comprises InGaAs. In some embodiments, the shallow implanted region 216 is at least one of doped or lightly doped with the first dopant. In some embodiments, the first dopant is Si, which acts a donor to comprise $Si^+$. In some embodiments, the first donor is Si, which acts as an acceptor to comprise $Si^-$. In some embodiments, the shallow implanted region 216 has thickness of between about 3 nm to about 30 nm. In some embodiments, a spacer 218 is formed contiguously to the gate structure 219, and over a portion of the shallow implanted region 216. In some embodiments, the spacer 218 comprises at least one of silicon oxide, silicon nitride, or silicon oxynitride (SiON).

In some embodiments, the spacer 218 has a thickness between about 5 nm to about 70 nm. In some embodiments a deep implanted region 220 is implanted by a second implantation 221, over the shallow implanted region 216 to form the doped region 223, as illustrated in FIG. 9. In some embodiments, the second implantation 221 comprises a dose of about $1e^{15}$ atoms/cm$^2$ or higher of at least one of the first dopant or another dopant at an energy of between about 0.5 keV to about 30 keV. In some embodiments, the deep implanted region 220 comprises a compound group of a at least one of a group 3 element, such as aluminum (Al), indium (In), or gallium (Ga), or a group 5 element, such as arsenic (As), phosphorous (P), antimony (Sb). In some embodiments, the deep implanted region 220 comprises InGaAs. In some embodiments, the deep implanted region 220 is at least one of doped or lightly doped with the first dopant or a dopant other than the first dopant. In some embodiments, the first dopant is Si, which acts as a donor to comprise Si$^+$. In some embodiments, the first donor is Si, which acts as an acceptor to comprise Si$^-$. In some embodiments, the deep implanted region 220 has thickness of between about 3 to about 30 nm. In some embodiments, the shallow implanted region 216 and the deep implanted region 220 comprise the doped region 223.

At 106, a protective agent is applied to the doped region 223 at a first temperature. In some embodiments, the semiconductor device 200 is in a MOCVD chamber. In some embodiments, the protective agent is arsine (AsH$_4$) gas. In some embodiments, the first temperature is between about 25° C. to about 100° C. In some embodiments, the arsine gas inhibits thermal damage to the doped region 223 at the first temperature.

At 108, the protective agent is applied to the doped region 223 while increasing the first temperature to a second temperature, and the protective agent continues to be applied at the second temperature. In some embodiments, the semiconductor device 200 is in a MOCVD chamber at 106-108. In some embodiments, the temperature increases at a rate of between about 0.1° C./s to about 20° C./s from the first temperature to the second temperature. In some embodiments, the second temperature is between about 75° C. to about 600° C. In some embodiments, a time to increase from the first temperature to the second temperature is between about 5 minutes to about 15 minutes. In some embodiments, the protective agent inhibits thermal damage to the doped region 223 during the increase in the temperature from the first temperature to the second temperature.

At 110, the doped region 223 is exposed to a second dopant and a growth agent, at the second temperature, while the protective agent continues to be applied. In some embodiments, the second dopant comprises a silicon precursor, such as silane (SiH$_4$) gas. In some embodiments, the silicon acts as a donor, forming a N-type semiconductor device 200. In some embodiments, the silicon acts as an acceptor, forming a P-type semiconductor device 200. In some embodiments, the growth agent comprises at least one group 3 element precursor or group 5 element precursor. In some embodiments, the group 3 element or the group 5 element precursors comprise at least one of trimethyl gallium (Ga(CH$_3$)$_3$), triethyl indium (In(CH$_3$)$_6$), trimethyl arsine (As(CH$_3$)$_3$), tertiary butyl-arsine (tBuAsH$_2$), trimethyl antimony (Sb(CH$_3$)$_3$), trimethyl aluminum (Al(CH$_3$)$_3$), tertiary butyl-phosphine (tBuPH$_2$), or trimethyl phosphate (P(CH$_3$)$_3$). In some embodiments, the protective agent inhibits thermal damage to the doped region 223 at the second temperature.

At 112, a growth region 222 is formed over the deep implanted region 220, as illustrated in FIG. 10. In some embodiments, the growth region is formed by MOCVD, at the second temperature, from at least the growth agent. In some embodiments, the growth region is formed by MOCVD, at the second temperature, from exposure to at least one of the growth agent, the second dopant or the protective agent. In some embodiments, the growth region comprises a compound group of a at least one of a group 3 element, such as aluminum (Al), indium (In), or gallium (Ga), a group 5 element, such as arsenic (As), phosphorous (P), antimony (Sb) or silicon. In some embodiments, the growth region comprises at least one of InGaSb or InGaAs doped with silicon. In some embodiments, the silicon is at least one of a donor (Si$^+$) or an acceptor (Si$^-$).

At 114, the protective agent is applied to the doped region 223 while the doped region 223 is exposed to the growth agent and the second dopant while the temperature is increased from the second temperature to a third temperature, as illustrated in FIG. 10. In some embodiments, the protective agent, the growth agent and the second dopant continue to be applied at the third temperature. In some embodiments, the growth region 222 in conjunction with the protective agent inhibits damage to the doped region 223 as the temperature increases from the second temperature to the third temperature. In some embodiments the growth region 222 continues to form as the temperature is increased from the second temperature to the third temperature. In some embodiments, the temperature increases at a rate of between about 0.1° C./s to about 100° C./s from the second temperature to the third temperature. In some embodiments, the third temperature is between about 500° C. to about 850° C. In some embodiments, a time to increase from the second temperature to the third temperature is between about 5 seconds to about 30 minutes.

At 116, the doped region 223 and growth region 222 are subject to annealing at the third temperature, while the protective agent continues to be applied to the doped region 223 and the growth region 222, and the doped region 223 and the growth region 222 continue to be exposed to the growth agent and the second dopant, as illustrated in FIG. 11. In some embodiments, the growth region 222 increases in height at the third temperature, as illustrated in FIGS. 10-11. In some embodiments, the growth region 222 comprises at least one of the growth agent, the second dopant or the protective agent. In some embodiments, the annealing of the doped region 223 forms a repaired doped region 228. In some embodiments, the repaired doped region 228 comprises at least one of the second dopant or the protective agent. In some embodiments, the repaired doped region 228 comprises the second dopant, where the second dopant came from the growth region 222. In some embodiments, the application of the third temperature forms activated dopant in the doped region 223 and the growth region 222. In some embodiments, the increase in the temperature from the second temperature to the third temperature forms a first repaired lattice structure in the doped region 223 and the application of the third temperature activates dopant in the doped region 223 forming the repaired doped region 228. In some embodiments, the repaired doped region comprises at least one of a repaired deep implanted region 230 or a repaired shallow implanted region 236. In some embodiments, a second repaired lattice structure in the channel 209 is formed at 116. In some embodiments, the first lattice structure of the doped region 223, and thus at least one of the shallow implanted region 216 or the deep implanted region 220, and the second lattice structure of the channel 209 were damaged during implantation at 104, as illustrated in FIGS. 8-9. In some embodiments, a repaired lattice structure comprises a lattice structure that has been repaired, such as made more uniform or regular, by the application of a temperature. In some embodiments, the increase in temperature from the first temperature to the third temperature causes the shallow implanted region 216 to migrate somewhat into the channel 209 under the gate structure 219, as illustrated in FIGS. 10-11. In some embodiments, the repaired shallow implanted region 236 is in contact with the gate structure 219.

At 118, the active region 226 is formed, comprising the repaired doped region 228, and the growth region 222, formed over the repaired doped region 228. In some embodiments, the active region 226 comprises at least one of a source or a drain. In some embodiments, the semiconductor device 200 is at least one of a first type or a second type semiconductor. In some embodiments, a first type semiconductor is N-type. In some embodiments, a second type semiconductor is P-type.

In some embodiments, a method of forming a semiconductor device comprises forming an active region adjacent a channel of the semiconductor device, the forming comprises implanting a first dopant adjacent the channel to form a doped region, increasing, after the implanting, a temperature from a first temperature to a second temperature while applying a protective agent to the doped region, and increasing the temperature from the second temperature to a third temperature while applying the protective agent to the doped region and while exposing the doped region to a second dopant and a growth agent to form a growth region over the doped region and annealing the doped region and the growth region to activate a dopant within the doped region and to form a first repaired lattice structure in the doped region to form a repaired doped region, the annealing performed while applying the protective agent to the doped region and to the growth region and while exposing the doped region and the growth region to the second dopant and the growth agent at the third temperature, the active region comprising the repaired doped region and the growth region over the repaired doped region.

In some embodiments, a semiconductor device comprises a gate structure over a channel, an active region adjacent the channel. In some embodiments, the active region comprises a repaired doped region comprising a first repaired lattice structure and a growth region over the repaired doped region, the repaired doped region comprising a first dopant and a second dopant, the second dopant from the growth region.

In some embodiments, a method of forming a semiconductor device comprises forming a gate structure over a channel of the semiconductor device, forming an active region adjacent the channel, the active region formation comprises forming a doped region adjacent the channel, the doped region formation comprises forming a shallow implanted region adjacent the channel and forming a deep implanted region adjacent the channel after the forming a shallow implanted region, increasing, after the implanting, a temperature from a first temperature to a second temperature while applying a protective agent to the doped region, and increasing the temperature from the second temperature to a third temperature while applying the protective agent to the doped region and while exposing the doped region to a second dopant and a growth agent to form a growth region over the doped region and annealing the doped region and the growth region to activate a dopant within the doped region and to form a first repaired lattice structure in the doped region to form a repaired doped region, the annealing performed while applying the protective agent to the doped region and to the growth region and while exposing the doped region and the growth region to the second dopant and the growth agent at the third temperature, the active region comprising the repaired doped region and the growth region over the repaired doped region.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a gate structure over a channel;
a semi-insulating barrier layer below the channel; and
an active region adjacent the channel, the active region comprising:
a repaired doped region comprising a first repaired lattice structure, wherein the repaired doped region has a sidewall in contact with the channel and in contact with the semi-insulating barrier layer; and
a growth region over the repaired doped region, the repaired doped region comprising a first dopant and a second dopant, the second dopant from the growth region.

2. The semiconductor device of claim 1, wherein the repaired doped region comprises a repaired shallow implanted region and a repaired deep implanted region, wherein the repaired deep implanted region has the sidewall in contact with the channel and in contact with the semi-insulating barrier layer.

3. The semiconductor device of claim 1, wherein at least one of the repaired doped region or the growth region comprises Si+.

4. The semiconductor device of claim 1, wherein at least one of the repaired doped region or the growth region comprises As.

5. The semiconductor device of claim 1, wherein the channel comprises a second repaired lattice structure.

6. The semiconductor device of claim 1, wherein the gate structure is in contact with the channel and the repaired doped region.

7. The semiconductor device of claim 1, wherein at least one of the channel, the repaired doped region or the growth region comprises at least one of a group 3 element or a group 5 element.

8. A semiconductor device, comprising:
a gate structure over a channel, wherein a sidewall spacer is adjacent the gate structure; and
an active region adjacent the channel, the active region comprising:
a doped region comprising a silicon precursor, wherein:
a top surface of the doped region is co-planar with a top surface of the channel,
the doped region comprises a shallow implanted region below the sidewall spacer,
the doped region comprises a deep implanted region adjacent the shallow implanted region, and
the deep implanted region has a sidewall in contact with the channel and in contact with a semi-insulating barrier layer below the channel; and
a growth region comprising the silicon precursor.

9. The semiconductor device of claim 8, wherein the silicon precursor is silane.

10. The semiconductor device of claim 8, wherein the doped region and the growth region comprise arsine.

11. The semiconductor device of claim 8, wherein the shallow implanted region has a first concentration of a dopant and the deep implanted region has a second concentration of the dopant.

12. The semiconductor device of claim 11, wherein the first concentration is less than the second concentration.

13. The semiconductor device of claim 8, wherein the growth region is above the deep implanted region.

14. The semiconductor device of claim 8, wherein the shallow implanted region is in contact with a bottom surface of the sidewall spacer and the deep implanted region is in contact with a bottom surface of the growth region.

15. The semiconductor device of claim 8, wherein the shallow implanted region is separated from the semi-insulating barrier layer by a distance.

16. A semiconductor device, comprising:
a gate structure over a channel; and
an active region adjacent the channel, the active region comprising:
a doped region comprising:
a first implanted region comprising a first concentration of a dopant;
a second implanted region comprising a second concentration of the dopant, wherein the second implanted region has a sidewall in contact with the channel and in contact with a semi-insulating barrier layer below the channel; and
a growth region over the second implanted region and comprising a second dopant.

17. The semiconductor device of claim 16, wherein a bottom surface of the growth region is in contact with the second implanted region.

18. The semiconductor device of claim 16, wherein the gate structure comprises a sidewall spacer, a bottom surface of the sidewall spacer in contact with the first implanted region.

19. The semiconductor device of claim 16, wherein:
the growth region contacts the second implanted region at an interface, and
the interface is co-planar with a top surface of the channel.

20. The semiconductor device of claim 16, the first concentration is less than the second concentration.

* * * * *

UNITED STATES PATENT AND TRADEMARK OFFICE
CERTIFICATE OF CORRECTION

PATENT NO. : 9,735,261 B2
APPLICATION NO. : 14/929523
DATED : August 15, 2017
INVENTOR(S) : Mao-Lin Huang et al.

It is certified that error appears in the above-identified patent and that said Letters Patent is hereby corrected as shown below:

On the Title Page

Item (57) titled Abstract, on the first line of the paragraph, please delete the word "devices" and insert therefor --device--

Signed and Sealed this
Ninth Day of January, 2018

Joseph Matal
*Performing the Functions and Duties of the*
*Under Secretary of Commerce for Intellectual Property and*
*Director of the United States Patent and Trademark Office*